United States Patent [19]

Takada et al.

[11] Patent Number: 5,312,651
[45] Date of Patent: May 17, 1994

[54] METHOD FOR MAKING A PREPREG OF AN EPOXY RESIN IMPREGNATED FIBERGLASS SUBSTRATE

[75] Inventors: Toshiharu Takada; Eiichiro Saito, both of Kooriyama, Japan

[73] Assignee: Matsushita Electric Works, Ltd., Osaka, Japan

[21] Appl. No.: 933,739

[22] Filed: Aug. 24, 1992

[30] Foreign Application Priority Data

Aug. 26, 1991 [JP] Japan ................ 3-213295

[51] Int. Cl.$^5$ .................... B05D 3/02
[52] U.S. Cl. ............................ 427/386
[58] Field of Search ..................... 427/386

[56] References Cited

U.S. PATENT DOCUMENTS

| | | | |
|---|---|---|---|
| 4,559,395 | 12/1985 | Jackson | 528/123 |
| 4,868,059 | 9/1989 | Walker et al. | 428/416 |
| 4,954,603 | 9/1990 | Takata et al. | 528/98 |
| 4,960,634 | 10/1990 | Boyko et al. | 427/386 |
| 5,104,691 | 4/1992 | Edwards et al. | 427/386 |
| 5,143,756 | 9/1992 | Cibulsky et al. | 427/386 |

FOREIGN PATENT DOCUMENTS

61-209221 9/1986 Japan.
4-356521 10/1992 Japan.

OTHER PUBLICATIONS

JP 61-209221, Sep. 1986, Shimamoto et al., English Translation.

*Primary Examiner*—Shrive Beck
*Assistant Examiner*—Erma Cameron
*Attorney, Agent, or Firm*—Armstrong, Westerman, Hattori, McLeland & Naughton

[57] ABSTRACT

A method for making a prepreg of an epoxy resin impregnated fiberglass substrate for preparing an electrical laminate provides prolonged shelf life of the prepreg, improved adhesive strength between the prepregs or between a metal foil and the prepreg, and also excellent heat resistance for soldering of the laminate, etc. The method of the present invention comprises preparing a resin mixture of an epoxy resin having at least two epoxy groups, a curing agent consisting of dicyandiamide and a halogenated diaminodiphenylmethane derivative of the formula

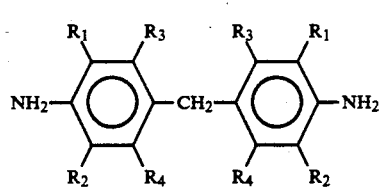

(wherein R1 stands for a hydrogen atom, or a lower alkyl group, R2 stands for a halogen atom, or a lower alkyl group, each of R3 and R4 stands for a lower alkyl group, a hydrogen or halogen atom, and also at least one of R3 and R4 stands for a halogen atom), and a catalyst for effecting the reaction between the epoxy resin and the curing agent, diluting the resin mixture in a solvent to form a resin varnish, impregnating a fiberglass substrate with the resin varnish, and then drying to partially cure the resin impregnated substrate, so that a B-stage cured prepreg is formed.

6 Claims, No Drawings

METHOD FOR MAKING A PREPREG OF AN EPOXY RESIN IMPREGNATED FIBERGLASS SUBSTRATE

BACKGROUND OF THE INVENTION

1. Field of the Invention

The present invention is directed to a method for making a prepreg of an epoxy resin impregnated fiberglass substrate, from which an electrical laminate is formed.

2. Description of the Prior Art

Various combinations of materials are utilized to make an electrical laminate for a printed circuit board. For example, as it has already been known, a method for making the electrical laminate comprises impregnating a substrate such as fiberglass cloth with a resin such as epoxy resin, drying to partially cure the resin impregnated substrate into a prepreg, forming sheets of the prepreg into a stacked array, laminating a metal foil on at least one side of the stacked array if necessary, and then heat-curing the stacked array with the metal foil under pressure in order to form the electrical laminate. However, heat resistance, drilling workability and humidity resistance of the thus obtained electrical laminate is not enough to form a small-sized or more dense integrated circuit. It is also required that adhesive strength between the prepregs or between the metal foil and the prepreg is improved. For improving the above problems, U.S. Pat. No. 4,868,059 describes that poly-functional epoxy resin and dicyandiamide as a curing agent are used to form a prepreg. The prior electrical laminate demonstrates high glass transition (Tg) temperature, strong adhesive strength between a copper foil and the prepreg, and also excellent heat resistance for soldering. However, the prior laminate also shows poor electrolytic corrosion resistance and humidity resistance. This undesirable performance results from dicyandiamide being used as the curing agent. On the other hand, another prior electrical laminate is made by using diaminodiphenylsulfone (DDS), diaminodiphenylmethane (DDM), or an alkylated or monohalogenated DDM, etc., as the curing agent. The prior electrical laminate has high Tg, but it also shows poor humidity resistance. A prepreg made in accordance with this prior art has short shelf life. An electrical laminate of another prior art is made through using an imido resin modified epoxy resin. The prior electrical laminate demonstrates excellent heat resistance, but there are problems with respect to low adhesive strength between prepregs and between a copper foil and the prepreg, and also expensive production cost for preparing the laminate. U.S. Pat. No. 4,868,059 also describes that a phenolic resin having a phenolic hydroxy group, for example, such as phenol novolac resin and cresol novolac resin, is utilized as the curing agent. The prior laminate has excellent humidity resistance and, heat resistance for soldering. A prepreg made in accordance with this prior art has long shelf life. However, there are problems with respect to low Tg, discoloration of the laminate which is caused by heating it or exposing it in ultraviolet light. The laminate also shows poor adhesive strength between the copper foil and the prepreg. Therefore, it is difficult to improve all problems described above, that is, a method for making a prepreg for forming an electrical laminate which has well-balanced properties such as excellent heat resistance, humidity resistance and electrolytic corrosion resistance, strong adhesive strength between the prepregs and between the metal foil and the prepreg, etc., has not been known yet.

SUMMARY OF THE INVENTION

The present invention relates to a method for making a prepreg, which has long shelf life, for preparing an electrical laminate with excellent heat resistance and humidity resistance, etc. The method of the present invention comprises preparing a resin mixture of (1) an epoxy resin having at least two epoxy groups;

(2) a curing agent consisting of dicyandiamide and a halogenated diaminodiphenylmethane (DDM) derivative represented by the formula

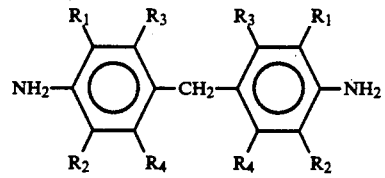

wherein R1 stands for a hydrogen atom or a lower alkyl group, R2 stands for a halogen atom or a lower alkyl group, each of R3 and R4 stands for a lower alkyl group, a hydrogen or halogen atom, and at least one of R3 and R4 stands for a halogen atom; and (3) a catalyst for effecting the reaction between the epoxy resin and the curing agent;

diluting components (1), (2) and (3) in a solvent in order to prepare a resin varnish, and impregnating a fiberglass substrate with the resin varnish, and then drying to partially cure the resin impregnated substrate into the prepreg.

It is, therefore, an object of the present invention to provide a method for making a prepreg, which has long shelf life, of an epoxy resin impregnated fiberglass substrate, from which an electrical laminate having excellent heat resistance, humidity resistance and strong adhesive strength, etc., is formed.

It is also preferred to effectively perform the method of the present invention that the component (1) is a brominated 3-functional epoxy resin which consists essentially of tetrabromobisphenol-A, bisphenol-A type epoxy resin and an epoxy resin of the following formula.

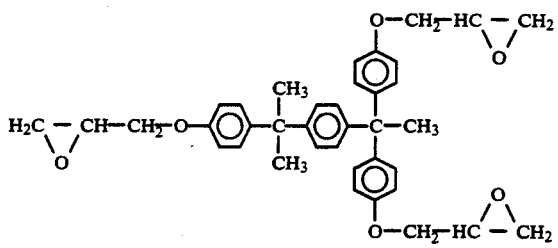

It is further preferred that the component (2) consists essentially of dicyandiamide and 2,2',3,3'-tetrachloro-4,4'-diaminodiphenylmethane in order to effectively perform the method of the present invention.

It is still further preferred that the component (2) is dissolved in a solvent prior to being incorporated with the component (1) and (3).

The present invention also pertains to compounding ratio of the components (1) and (2) when the resin mixture is prepared. That is, it is preferred that the curing agent comprises 0.1 to 0.5 equivalents of dicyandiamide and 0.1 to 0.8 equivalents of a halogenated DDM derivative, respectively, based on one epoxy group of the epoxy resin such that the curing agent is incorporated in a total amount of 0.8 to 1.2 equivalents based on one epoxy group of the epoxy resin.

The process for making the prepreg of the present invention will be detailed hereinafter.

DETAILED DESCRIPTION OF THE INVENTION

A prepreg of an epoxy resin impregnated fiberglass substrate for preparing an electrical laminate is made according to a method of the present invention.

A first step of the method of the present invention is that an epoxy resin having at least two epoxy groups is incorporated with a curing agent and a catalyst to prepare a resin mixture. The epoxy resin consists of at least one resin selected from bisphenol-A type epoxy resin, bisphenol-F type epoxy resin, bisphenol-S type epoxy resin, diglycidyl ether of 2,6-xylenol dimer, phenol novolac epoxy resin, cresol novolac epoxy resin, bisphenol-A type novolac epoxy resin, bisphenol-F type novolac epoxy resin, epoxy resin having isocyanurate group, epoxy resin having hydantoin group, 3-functional epoxy resin, 4-functional epoxy resin, epoxy resin having glycidylamine group, epoxy resin having glycidyl diaminophenyl ether, alicyclic epoxy resin, and brominated non-flammable resin of the resin mentioned above and the like. On the other hand, the curing agent consists of dicyandiamide and a halogenated diaminodiphenylmethane (DDM) derivative having at least two halogen atoms of the formula

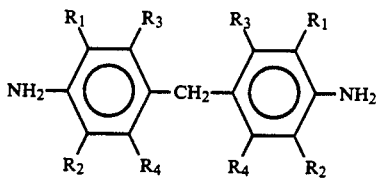

wherein R1 stands for a hydrogen atom or a lower alkyl group, R2 stands for a halogen atom or a lower alkyl group, each of R3 and R4 stands for a lower alkyl group, a hydrogen or halogen atom, and at least one of R3 and R4 stands for a halogen atom. Each lower alkyl group is selected from an ethyl, methyl, propyl, isopropyl and butyl group, etc. It is also preferred to select a chlorine atom as each halogen atom described above. By the way, there are some strong points with respect to dicyandiamide, for example, improving adhesive strength between a prepreg and a metal foil or between the prepregs, and extending shelf life of the prepreg. Contrary, there are some weak points of dicyandiamide, for example, leading to poor humidity resistance and electrolytic corrosion resistance of the electrical laminate. On the other hand, there are some strong points with respect to the halogenated DDM derivative, for example, improving heat resistance of the electrical laminate. Contrary, there are also some weak points of the halogenated DDM derivative, for example, shortening shelf life of a prepreg. Therefore, when dicyandiamide and the halogenated DDM derivative are utilized as the curing agent, the curing agent offsets the above described weak points and also maintains the above described strong points, so that the electrical laminate having the well-balanced properties can be made in accordance with the method of the present invention.

Particularly, the prepreg of the present invention which is made through using the dicyandiamide and the diaminodiphenylmethane derivative having halogen atoms has a much longer shelf life compared with a prepreg made through using the dicyandiamide and a diaminodiphenylmethane which does not have halogen atom such as, for example, a diaminodiphenylmethane(R1=R2=R3=R4=hydrogen atom).

It is further preferred that the curing agent comprises 0.1 to 0.5 equivalents of dicyandiamide and 0.1 to 0.8 equivalents of the halogenated DDM derivative, respectively based on one epoxy group of the epoxy resin. By the way, a total additive amount of a curing agent of the prior art is generally one equivalent based on one epoxy group of the epoxy resin. However, since dicyandiamide not only reacts with the epoxy group of the epoxy resin but also enhances polymerization of the epoxy group, an additive amount of dicyandiamide is preferred to be about 0.5 equivalents based on one epoxy group of the epoxy resin to obtain the desired effect of the curing agent. Consequently, the curing agent is incorporated in a total amount of 0.8 to 1.2 equivalents based on one epoxy group of the epoxy resin. When the total amount of the curing agent is out of the above range, the so obtained laminate does not have enough heat resistance, humidity resistance, and adhesive strength. When the curing agent consists of dicyandiamide compound having at least two phenolic hydroxy groups per molecule, and the halogenated DDM derivative, the so obtained prepreg or laminate has excellent humidity resistance. The compound consists of at least one compound selected from bisphenol-A, bisphenol-F, bisphenol-S, polyvinylphenol, β-naphthol, phenol novolac resin, cresol novolac resin, bisphenol-A type novolac resin, alkylphenol novolac resin, 3-functional novolac resin having triphenylmethane group which is synthesized from phenol and hydroxybenzaldehyde, brominated compound of the above mentioned compound, and phenolic compound of the above mentioned compound and the like. By the way, it is preferred that the curing agent is dissolved in a solvent of at least one solvent selected from methylethylketone (MKE), acetone, ethylene glycol monomethyl ether, propylene glycol monomethyl ether, methanol, ethanol, toluene, xylene, dimethylformamide (DMF), dimethylacetamide (DMAc), N-methylpyrrolidone (NMP), methylcellosolve (MC), dioxane and the like, and then the solvent including the curing agent is heated at 30° C. to 150° C. for 10 to 60 minutes prior to being incorporated with the epoxy resin and the catalyst. The dissolving of the curing agent into the solvent is effective to prevent deposition of dicyandiamide and uniformly incorporate the curing agent with the epoxy resin and the catalyst. The catalyst consists of at least one catalyst selected from imidazole compounds such as, for example, imidazole, 2-ethylimidazole, 2-ethyl-4-methylimidazole, and 2-phenylimidazole, organic phosphorous compounds such as, for example, ethyltriphenylphosphonium bromide, and tetraphenylphosphonium chloride, tertiary amine such as, for example, benzyldimethylamine, α-methylbenzyldimethylamine, and 2-(dimethylaminomethyl)phenol, quaternary ammonium compounds such as, for example, benzyltrimethylammonium hydroxide, benzyltrimethylammonium chloride, and tetramethylammonium bromide, and boron trifluoride complex salts and the like. The resin mixture is ordinarily diluted in a solvent to prepare a resin varnish. The solvent consists of at least one solvent selected from methylethylketone (MKE), acetone, ethylene glycol monomethyl ether, propylene glycol monomethyl ether, methanol, ethanol, toluene, xylene, dimethylformamide (DMF), dimethylacetamide (DMAc), N-methylpyrrolidone (NMP), methylcellosolve (MC), dioxane and mixtures thereof and the like. The diluting of the resin mixture in the solvent is effective to uniformly and readily impregnate the resin mixture into a fiberglass substrate. It is further preferred that the resin mixture is diluted in the solvent so as to have a solid content of 50% to 70% by weight.

A second step of the method of the present invention is that the resin varnish is impregnated into the fiberglass substrate such as, for example, glass cloth, glass paper and glass mat. The fiberglass substrate can also include fiber such as, natural fiber and organic synthetic fiber, etc., and paper such as, kraft paper, linter paper, etc.

A third step of the method of the present invention is that the epoxy resin impregnated fiberglass substrate is heat-cured at a temperature of 120° C. to 180° C. for 3 to 10 minutes, so that a B-stage cured prepreg of the epoxy resin impregnated fiberglass substrate is obtained.

The prepreg is utilized to form the electrical laminate. That is to say, sheets of the prepreg are formed into a stacked array, and then a sheet of metal foil is piled on at least one side of the stacked array. The metal foil is useful to give circuit paths on the laminate, and selected from copper, aluminum and stainless steel, etc. The stacked array with the metal foil is compressed at a pressure of 10 to 50 kg/cm$^2$ while being heated at a temperature of 150° C. to 200° C. in order to form a metal clad laminate. On the other hand, in case of forming a multilayer metal clad laminate, since a surface of the metal foil interposed between the prepregs is ordinarily oxidized in order to improve the adhesive strength between the metal foil and the prepreg, it is preferred that a stacked array, which consists of sheets of the prepreg and the metal foils, is heated at a temperature of 150° C. to 180° C. under the above pressure range to form the multilayer laminate. When the stacked array is heated at a temperature of less than 150° C., it is not perfectly cured, so that the so obtained laminate does not have enough heat resistance and adhesive strength between the metal foil and the prepreg. On the other hand, when the stacked array is heated at more than 180° C., the adhesive strength is not also improved. The following examples are illustrative of the invention, but are not to be construed as to limiting the scope thereof in any manner.

EXAMPLE 1

As an epoxy resin, 100 g (0.237 equiv.) of VF-2803 (trade name of epoxy resin manufactured by Mitsui Petrochemical Industries, Ltd.), which is a brominated 3-functional epoxy resin having an epoxide equivalent weight (EEW) of 422 and 19% of bromine content, and consists essentially of tetrabromobisphenol-A, bisphenol-A type epoxy resin and an epoxy resin of the formula

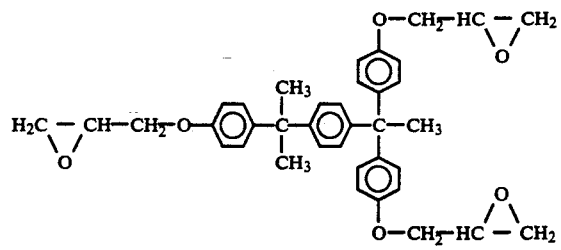

was employed. On the other hand, a curing agent consisting of 2.0 g (0.0952 equiv.) of dicyandiamide and 4.5 g (0.0474 equiv.) of C-BS300 (trade name of a curing agent manufactured by Nippon KayaKu Co., Ltd.) which is bis(4-amino-2-chloro-3,5-diethylphenyl)methane otherwise known as 4,4'-methylenebis(3-chloro-2,6-diethylaniline), and also 0.05 g of 2-ethyl-4-methylimidazole as a catalyst were dissolved into 50 g of a mixture solvent consisting of dimethylformamide (DMF) and methylcellosolve (MC), in quantities which provide DMF to MC ratio 1:1, prior to being incorporated with the epoxy resin. Subsequently, the epoxy resin was incorporated with the mixture solvent including the curing agent and the catalyst in order to prepare a resin varnish. The resin varnish was impregnated in a glass cloth 216L (trade name of glass cloth manufactured by Asahi-schwebel Co., Ltd.) which is of the MIL-STD-2116 type so as to have a resin content of about 43% or about 50% by weight and a gel time of about 180 seconds at 170° C. The resin impregnated glass cloth was then heated in order to obtain a prepreg which is B-stage cured. Since the curing agent is dissolved in the mixture solvent prior to the incorporating, deposition of dicyandiamide was not observed in the prepreg. Thus obtained prepreg was examined with respect to the shelf life, which was defined to be a time period during which the prepreg can be successfully cured into a final product without causing a void like blister or a void results from poor varnish fluidity under the same condition as initially selected. The prepreg was left in relative humidity of 50% at a temperature of 20° C. to examine the shelf life.

In order to examine glass transition temperature (Tg), water absorptivity, electrolytic corrosion resistance, and moldability of an electrical laminate, eight plies of the prepreg having 43 wt. % of the resin content were formed into a stacked array, and then a sheet of thick copper foil having a thickness of 35 μm was piled on each outer prepreg of the stacked array. Subsequently, the stacked array with the thick copper foils was heat-cured while being compressed, that is, the array is firstly compressed under 10kg/cm$^2$ at a temperature of 130° C. to 135° C., and then is compressed under 40kg/cm$^2$ at a temperature of about 170° C., so that double-sided copper clad laminate having a thickness of 0.8 mm was formed. The water absorptivity of the double sided laminate was determined by measuring gain in weight of the laminate after it was dipped in water at 23° C. for 24 hours. The moldability of the double-sided laminate was examined by observing occurrence of microvoids in the laminate after the thick copper foil was removed from a surface of the laminate by a chemical etching. The electrolytic corrosion resistance of the double-sided laminate was examined with respect to conductive anodic filaments (CAF), which was defined to be a time period until which insulation resistance between the adjacent through holes which were respectively drilled on the double-sided laminate becomes less than $10^8 \Omega$ in relative humidity of 85% at a temperature of 85° C. when one hundred volts are impressed between them. Prior to the examining of the CAF, a copper film was plated on the inside of each through hole, and the thick copper foil was removed from the surface of the laminate. A distance between the adjacent through holes on the laminate was 0.5 mm. A diameter of each through hole was 0.9 mm. The glass transition temperature (Tg) of the double-sided laminate was measured in accordance with a thermo mechanical analysis.

A copper oxide layer was formed on a surface of each thick copper foil of the double-sided laminate in order to improve adhesive strength between the epoxy resin and the thick copper foil by means of a chemical oxidation method as described in U.S. Pat. No. 4,642,161. Two plies of the prepreg having 50 wt. % of the resin content were then stacked on each copper oxide layer of the laminate, and also a sheet of thin copper foil having a thickness of 18 μm was piled on each of the two piles of the prepreg. The double-sided laminate with the prepregs and the thin copper foils is heat cured again while being compressed under the same condition described above, so that a four-layer copper clad laminate having a thickness of 1.2 mm as a final product was formed. The adhesive strength was measured by means of peeling off the laminated thick copper foil from the four-layer laminate. The heat resistance for soldering of the four-layer laminate was examined by observing occurrence of blister in the laminate after the laminate, which had been previously left in relative humidity of 90% at a temperature of 40° C. for 96 hours, was dipped in a solder bath for 20 seconds.

EXAMPLE 2

A prepreg, a double-sided copper clad laminate and a four-layer copper clad laminate of example 2 were made according to the same method of example 1 except that 4 g (0.0474 equiv.) of TCDAM (trade name of a curing agent manufactured by Ihara Chemical Industry Co., Ltd.), which is 2,2',3,3'-tetrachloro-4,4'-diaminodiphenylmethane, was used in place of C-BS300 (trade name of a curing agent manufactured by Nippon KayaKu Co., Ltd.), which is bis(4-amino-2-chloro-3,5-diethylphenyl)methane otherwise known as 4,4'-methylenebis(3-chloro-2,6-diethylaniline) in example 1, and also the curing agent was dissolved in the mixture solvent and then heated at 100° C. for 20 min prior to being incorporated with the epoxy resin. Similarly to example 1, various properties of the prepreg and the laminates of example 2 were examined.

EXAMPLE 3

A prepreg, a double-sided copper clad laminate and a four-layer copper clad laminate of example 3 were made according to the same method of example 1 except that a curing agent consisting of 1.0 g (0.0476 equiv.) of dicyandiamide and 2.25 g (0.0237 equiv.) of C-BS300 (trade name of curing agent manufactured by Nippon KayaKu Co., Ltd.) which is bis(4-amino-2-chloro-3,5-diethylphenyl)methane otherwise known as 4,4'-methylenebis(3-chloro-2,6-diethylaniline), and also 0.04 g of 2-ethyl-4-methylimidazole as the catalyst were dissolved into 49 g of the mixture solvent of example 1. Similarly to example 1, various properties of the prepreg and the laminates of example 3 were examined.

EXAMPLE 4

A prepreg, a double-sided copper clad laminate and a four-layer copper clad laminate of example 4 were made according to the same method of example 1 except that a curing agent consisting of 1.6 g (0.0762 equiv.) of dicyandiamide and 3.6 g (0.0379 equiv.) of C-BS300 (trade name of curing agent manufactured by Nippon KayaKu Co., Ltd.) which is bis(4-amino2-chloro-3,5-diethylphenyl)methane, and also 0.05 g of 2-ethyl4-methylimidazole as the catalyst were dissolved into 50 g of the mixture solvent of example 1. Similarly to example 1, various properties of the prepreg and the laminates of example 4 were examined.

EXAMPLE 5

A prepreg, a double-sided copper clad laminate and a four-layer copper clad laminate of example 5 were made according to the same method of example 1 except that a curing agent consisting of 1.991 g (0.0948 equiv.) of dicyandiamide and 9.006 g (0.0948 equiv.) of C-BS300 (trade name of curing agent manufactured by Nippon KayaKu Co., Ltd.) which is bis(4-amino-2-chloro-3,5-diethylphenyl)methane otherwise known as 4,4'-methylenebis(3-chloro-2,6-diethylaniline), and also 0.6 g of 2-ethyl-4-methylimidazole as the catalyst were dissolved into 51 g of the mixture solvent of example 1. Similarly to example 1, various properties of the prepreg and the laminates of example 5 were examined.

EXAMPLE 6

A prepreg, a double-sided copper clad laminate and a four-layer copper clad laminate of example 6 were made according to the same method of example 1 except that a curing agent consisting of 2.449 g (0.1185 equiv.) of dicyandiamide and 11.258 g (0.1185 equiv.) of C-BS300 (trade name of curing agent manufactured by Nippon KayaKu Co., Ltd.) which is bis(4-amino-2-chloro-3,5-diethylphenyl)methane otherwise known as 4,4'-methylenebis(3-chloro-2,6-diethylaniline), and also 0.08 g of 2-ethyl-4-methylimidazole as the catalyst were dissolved into 52 g of the mixture solvent of example 1. Similarly to example 1, various properties of the prepreg and the laminates of example 6 were examined.

EXAMPLE 7

A prepreg, a double-sided copper clad laminate and a four-layer copper clad laminate of example 7 were made according to the same method of example 1 except that a curing agent consisting of 1.24 g (0.0590 equiv.) of dicyandiamide, 5.63 g (0.0593 equiv.) of C-BS300 (trade name of curing agent manufactured by Nippon KayaKu Co., Ltd.) which is bis(4-amino-2-chloro-3,5-diethylphenyl)methane otherwise known as 4,4'-methylenebis(3-chloro-2,6-diethylaniline), and 7.11 g (0.0593 equiv.) of D-5 (trade name of curing agent manufactured by Tohto Kasei Co., Ltd.) which is a cresol novolac resin as a compound having at least two phenolic hydroxide groups per molecule, and also 0.05 g of 2-ethyl-4-methylimidazole as the catalyst were dissolved into 50 g of the mixture solvent of example 1. Similarly to example 1, various properties of the prepreg and the laminates of example 7 were examined.

EXAMPLE 8

A prepreg, a double-sided copper clad laminate and a four-layer copper clad laminate of example 8 were made according to the same method of example 1 except that an epoxy resin consisting of 399 g (0.798 equiv.) of DER-514 (trade name of epoxy resin manufactured by Dow Chemical Japan Ltd.), which is a brominated bisphenol-A type 2-functional epoxy resin having an EEW of 500 and 20% of bromine content, and 44 g (0.205 equiv.) of YDCN-701 (trade name of epoxy resin manufactured by Tohto Kasei Co., Ltd.) which is a cresol novolac 2-functional epoxy resin having an EEW of 250 was employed, and also a curing agent consisting of 7.35 g (0.35 equiv.) of dicyandiamide and 28.5 g (0.30 equiv.) of C-BS300 (trade name of curing agent manufactured by Nippon KayaKu Co., Ltd.) which is bis(4-amino-2-chloro-3,5-diethylphenyl)methane (otherwise known as 4,4'-methylenebis(3-chloro-2,6-diethylaniline)) and 0.4 g of 2-ethyl-4-methylimidazole as the catalyst, were dissolved into 240 g of a mixture solvent consisting of dimethylformamide (DMF) and dioxane, in quantities which provide DMF to dioxane ratio 1:1, prior to being incorporated with the epoxy resin. Similarly to example 1, various properties of the prepreg and the laminates of example 8 were examined.

COMPARATIVE EXAMPLE 1

A prepreg, a double-sided copper clad laminate and a four-layer copper clad laminate of comparative example 1 were made according to the same method of example 1 except for using 2.5 g (0.1190 equiv.) of dicyandiamide in place of the curing agent utilized in example 1. The deposition of the dicyandiamide was observed on thus obtained prepreg. Similarly to example 1, various properties of the prepreg and the laminates of comparative example 1 were examined.

COMPARATIVE EXAMPLE 2

A prepreg, a double-sided copper clad laminate and a four-layer copper clad laminate of comparative example 1 were made according to the same method of example 1 except for using 18.4 g (0.0237 equiv.) of diaminodiphenylmethane in place of the curing agent utilized in example 1. Similarly to example 1, various properties of the prepreg and the laminates of comparative example 2 were examined.

COMPARATIVE EXAMPLE 3

A prepreg, a double-sided copper clad laminate and a four-layer copper clad laminate of comparative example 3 were made according to the same method of example 1 except for using 2 g (0.0952 equiv.) of dicyandiamide and 3.7 g (0.0481 equiv.) of diaminodiphenylmethane in place of the curing agent utilized in example 1. Similarly to example 1, various properties of the prepreg and the laminates of comparative example 3 were examined.

COMPARATIVE EXAMPLE 4

A prepreg, a double-sided copper clad laminate and a four-layer copper clad laminate of comparative example 4 were made according to the same method of example 8 except for using 10.5 g (0.5 equiv.) of dicyandiamide in place of the curing agent utilized in example 8. Similarly to example 8, various properties of the prepreg and the laminates of comparative example 4 were examined.

An additive amount of the curing agent into the epoxy resin and the various properties of the prepreg, the double-sided copper clad laminate and the four-layer copper clad laminate such as shelf life of the prepreg, water absorptivity, glass transition temperature and heat resistance for soldering, etc., with respect to examples 1–8 and comparative examples 1–4 are shown in TABLES 1 AND 2. Each prepreg made according to the method of the present invention (examples 1–8) has longer shelf life, which is at least three months, as compared with comparative examples 1–4. The double-sided laminates having the thickness of 0.8 mm of examples 1–8, respectively, have excellent electrolytic corrosion resistance and low water absorptivity without causing any blister in the laminate. The four-layer laminates having the thickness of 1.2 mm of examples 1–8, respectively, demonstrate strong adhesive strength between the laminated thick copper foil and the epoxy resin, and also excellent heat resistance for soldering without causing any blister in the four-layer laminate. For example, comparative example 2 has excellent electrolytic corrosion resistance, heat resistance for soldering, and low water absorptivity, but it also shows short shelf life of the prepreg and poor adhesive strength. On the other hand, for examples, example 1 and 2 of the present invention have well-balanced and excellent properties as shown in TABLE 1.

TABLE 1

An additive amount of curing agent into an epoxy resin and various properties of a prepreg, a double-sided copper clad laminate and a four-layer copper clad laminate with respect to examples 1–6 of the present invention.

| | | Example | | | | | |
|---|---|---|---|---|---|---|---|
| | | 1 | 2 | 3 | 4 | 5 | 6 |
| Curing agent | Dicyandiamide (equiv.) | 0.0952 | 0.0952 | 0.0476 | 0.0762 | 0.0948 | 0.1185 |
| | Halogenated DDM[*1] derivative (equiv.) | 0.0474 | 0.0474 | 0.0237 | 0.0379 | 0.0948 | 0.1185 |
| | Poly-functional phenol resin (equiv.) | — | — | — | — | — | — |
| Prepreg | Shelf life (month) | 3 | 6 | 3 | 3 | 3 | 3 |
| Double-sided copper clad laminate (thickness: 0.8 mm) | Glass transition (Tg) temperature (°C.) | 180 | 177 | 164 | 178 | 177 | 170 |
| | Electrolytic corrosion resistance (hrs) | 2000< | 2000< | 2000< | 2000< | 2000< | 1200 |
| | Water absorptivity (wt %) | 0.09 | 0.09 | 0.08 | 0.09 | 0.10 | 0.13 |
| | Moldability[*2] | ○ | ○ | ○ | ○ | ○ | ○ |
| Four-layer copper clad laminate (thickness: 1.2 mm) | Adhesive strength (kg/cm) | 0.7 | 0.7 | 0.6 | 0.7 | 0.7 | 0.6 |
| | Heat resistance for soldering[*3] | ○ | ○ | ○ | ○ | ○ | ○ |

[*1]DDM = diaminodiphenylmethane
[*2]○; good, x; occurrence of blister
[*3]○; good, x; occurrence of blister

TABLE 2

An additive amount of curing agent into an epoxy resin and various properties of a prepreg, a double-sided copper clad laminate and a four-layer copper clad laminate with respect to examples 7 and 8 of the present invention and comparative examples 1-4.

| | | example | | comparative example | | | |
|---|---|---|---|---|---|---|---|
| | | 7 | 8 | 1 | 2 | 3 | 4 |
| Curing agent | Dicyandiamide (equiv.) | 0.0590 | 0.35 | 0.1190 | — | 0.0952 | 0.5 |
| | Halogenated DDM(*1) derivative (equiv.) | 0.0593 | 0.30 | — | 0.237 | 0.0481 | — |
| | Poly-functional phenol resin (equiv.) | 0.0593 | — | — | — | — | — |
| Prepreg | Shelf life (month) | 12 | 3 | 3 | 1.5 | 1.5 | 3 |
| Double-sided copper clad laminate (thickness: 0.8 mm) | Glass transition (Tg) temperature (°C.) | 155 | 140 | 168 | 182 | 179 | 132 |
| | Electrolytic corrosion resistance (hrs) | 2000< | 1800 | 800 | 2000 | 2000 | 700 |
| | Water absorptivity (wt %) | 0.06 | 0.09 | 0.12 | 0.09 | 0.10 | 0.12 |
| | Moldability(*2) | o | o | x | o | o | o |
| Four-layer copper clad laminate (thickness: 1.2 mm) | Adhesive strength (kg/cm) | 0.6 | 1.2 | 0.6 | 0.2 | 0.4 | 1.2 |
| | Heat resistance for soldering(*3) | o | o | x | o | o | o |

(*1)DDM = diaminodiphenylmethane
(*2)o; good, x; occurrence of blister
(*3)o; good, x; occurrence of blister

What is claimed is:

1. A method for making a prepreg of an epoxy resin impregnated fiberglass substrate, said method comprising the steps of preparing a resin mixture of
   (1) a brominated 3-functional epoxy resin, which consists essentially of tetrabromobisphenol-A, bisphenol-A epoxy resin and an epoxy resin of the formula;

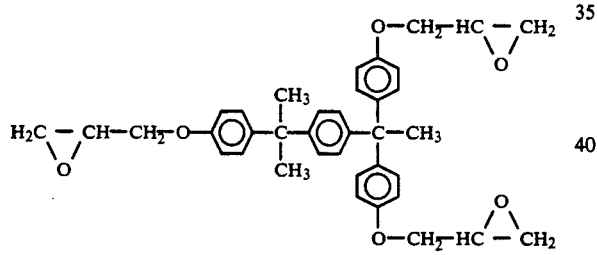

(2) dicyandiamide and 4,4'-methylenebis(3-chloro-2,6-diethylaniline) as a curing agent; and
   (3) 2-ethyl-4-methylimidazole as a catalyst;
   diluting the resin mixture in a solvent to form a resin varnish;
   impregnating a fiberglass substrate with said resin varnish; and
   drying to partially cure the resin impregnated substrate into said prepreg.

2. A method according to claim 1, wherein said curing agent comprises 0.1 to 0.5 equivalents of dicyandiamide and 0.1 to 0.8 equivalents of 4,4'-methylenebis(3-chloro-2,6-diethylaniline), respectively, based on one epoxy group of said epoxy resin such that said curing agent is incorporated in a total amount of 0.8 to 1.2 equivalents based on one epoxy group of said epoxy resin.

3. A method according to claim 1, wherein said curing agent is dissolved in a solvent prior to being incorporated with said epoxy resin and said catalyst.

4. A method for making a prepreg of an epoxy resin impregnated fiberglass substrate, said method comprising the steps of
   preparing a resin varnish which is formed by dissolving, in a solvent,
   (1) a brominated 3-functional epoxy resin, which consists essentially of tetrabromobisphenol-A, bisphenol-A epoxy resin and an epoxy resin of the formula:

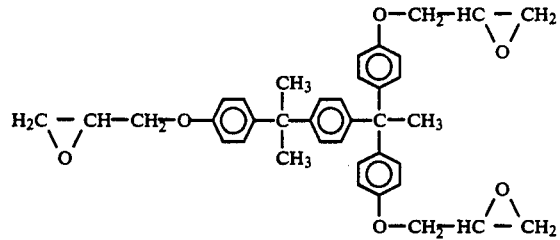

(2) dicyandiamide and 2,2',3,3'-tetrachloro-4,4'-diaminodiphenylmethane as a curing agent; and
   (3) 2-ethyl-4-methylimidazole as a catalyst; wherein said curing agent is dissolved in said solvent prior to being incorporated with said epoxy resin and catalyst;
   impregnating a fiberglass substrate with said resin varnish; and
   drying to partially cure the resin impregnated substrate into said prepreg.

5. A method according to claim 4, wherein said curing agent comprises 0.1 to 0.5 equivalents of dicyandiamide and 0.1 to 0.8 equivalents of 2,2',3,3'-tetrachloro-4,4'-diaminodiphenylmethane, respectively, based on one epoxy group of said epoxy resin such that said curing agent is incorporated in a total amount of 0.8 to 1.2 equivalents based on one epoxy group of said epoxy resin.

6. A method as set forth in claim 4, wherein said solvent is a mixture of dimethylformamide and methylcellosolve.

* * * * *